(12) United States Patent
Lai (10) Patent No.: US 12,094,514 B2
(45) Date of Patent: Sep. 17, 2024

(54) MEMORY DEVICE AND MEMORY SYSTEM WITH A SELF-REFRESH FUNCTION

(71) Applicant: Winbond Electronics Corp., Taichung (TW)

(72) Inventor: Chih-Chiang Lai, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 193 days.

(21) Appl. No.: 17/884,053

(22) Filed: Aug. 9, 2022

(65) Prior Publication Data
US 2023/0215486 A1 Jul. 6, 2023

(30) Foreign Application Priority Data
Jan. 5, 2022 (TW) .................................. 111100316

(51) Int. Cl.
*G11C 11/406* (2006.01)
*G11C 11/408* (2006.01)

(52) U.S. Cl.
CPC ... *G11C 11/40615* (2013.01); *G11C 11/40611* (2013.01); *G11C 11/4085* (2013.01); *G11C 11/4087* (2013.01); *G11C 2211/4067* (2013.01)

(58) Field of Classification Search
CPC ......... G11C 11/40615; G11C 11/40611; G11C 11/4085; G11C 11/4087; G11C 11/40622; G11C 2211/4067
See application file for complete search history.

(56) References Cited

U.S. PATENT DOCUMENTS

| 9,349,431 | B1 | 5/2016 | Saifuddin et al. | |
|---|---|---|---|---|
| 2005/0099868 | A1* | 5/2005 | Oh | G11C 11/40622 365/201 |
| 2005/0169083 | A1* | 8/2005 | Riho | G11C 11/40615 365/222 |
| 2006/0104141 | A1* | 5/2006 | Jo | G11C 11/40611 365/222 |
| 2006/0198226 | A1* | 9/2006 | Takahashi | G11C 11/40615 365/222 |
| 2008/0049532 | A1 | 2/2008 | Kajigaya | |
| 2012/0134224 | A1* | 5/2012 | Shim | G11C 11/40615 365/201 |

(Continued)

FOREIGN PATENT DOCUMENTS

| CN | 110945589 A | 3/2020 |
|---|---|---|
| TW | I300226 B | 8/2008 |
| TW | 201916033 A | 4/2019 |

*Primary Examiner* — Mushfique Siddique
(74) *Attorney, Agent, or Firm* — Birch, Stewart, Kolasch & Birch, LLP (57) ABSTRACT

A memory device coupled to a memory controller and including a memory array and an access circuit is provided. The memory array includes a plurality of cells. Each of the cells is coupled to a word-line. The access circuit is coupled between the memory controller and the memory array. In a normal mode, the access circuit executes a refresh action for the cells which are coupled to at least one word-line in response to the memory controller outputting an auto-refresh command. In a standby mode, the access circuit selects one of the word-lines and determines whether to execute the refresh action for the cells coupled to the selected word-line according to the retention capability of the selected word-line at regular time intervals.

18 Claims, 5 Drawing Sheets

(56) References Cited

U.S. PATENT DOCUMENTS

2013/0159617 A1\* 6/2013 Yu ..................... G11C 11/406
                                                    711/106
2019/0115069 A1\* 4/2019 Lai ..................... G11C 11/409

\* cited by examiner

FIG. 1

| Retention capability | Timing of refresh rate | Refresh period | Capability information |
|---|---|---|---|
| 40ms~100ms | 32ms | 3.9us | [1,1] |
| 101ms~192ms | 64ms | 7.8us | [0,0] |
| 193ms~280ms | 128ms | 15.6us | [0,1] |
| >281ms | 256ms | 31.3us | [1,0] |

| Capability information | | P0 | P1 | P2 | P3 | P4 | P5 | P6 | P7 |
|---|---|---|---|---|---|---|---|---|---|
| C1 | C0 | | | | | | | | |
| 0 | 0 | 1 | 0 | 1 | 0 | 1 | 0 | 1 | 0 |
| 0 | 1 | 1 | 0 | 0 | 0 | 1 | 0 | 0 | 0 |
| 1 | 0 | 1 | 0 | 0 | 0 | 0 | 0 | 0 | 0 |
| 1 | 1 | 1 | 1 | 1 | 1 | 1 | 1 | 1 | 1 |

FIG. 5

MEMORY DEVICE AND MEMORY SYSTEM WITH A SELF-REFRESH FUNCTION

CROSS REFERENCE TO RELATED APPLICATIONS

This Application claims priority of Taiwan Patent Application No. 111100316, filed on Jan. 5, 2022, the entirety of which is incorporated by reference herein.

BACKGROUND OF THE INVENTION

Field of the Invention

The invention relates to a memory device, and more particularly to a memory device with a self-refresh function.

Description of the Related Art

In Dynamic Random Access Memory (DRAM), each memory cell includes a transistor and a capacitor to store one bit of data. Since there are various leakage paths surrounding the capacitor, the amount of charge stored in the capacitor is not sufficient to correctly identify the data, resulting in data damage. To maintain the amount of charge stored in the capacitor, even if the DRAM operates in a standby mode, the capacitor needs to be refreshed periodically. Therefore, the DRAM's standby current cannot be reduced effectively.

BRIEF SUMMARY OF THE INVENTION

In accordance with an embodiment of the disclosure, a memory device is coupled to a memory controller and comprises a memory array and an access circuit. The memory array comprises a plurality of cells. Each of the cells is coupled to a word-line. The access circuit is coupled between the memory controller and the memory array. In a normal mode, the access circuit executes a refresh action for the cells which are coupled to at least one word-line in response to the memory controller outputting an auto-refresh command. In a standby mode, the access circuit selects one of the word-lines and determines whether to execute the refresh action for the cells coupled to the selected word-line according to the retention capability of the selected word-line at regular time intervals.

In accordance with another embodiment of the disclosure, a memory system comprises a memory controller and a memory device. The memory controller provides data and outputs an auto-refresh command. The memory device is coupled to the memory controller and operates in a normal mode or a standby mode. The memory device comprises a memory array and an access circuit. The memory array comprises a plurality of cells. Each of the cells is coupled to a word-line. The access circuit is coupled between the memory controller and the memory array. In the normal mode, the access circuit executes a refresh action for the cells which are coupled to at least one word-line according to the auto-refresh command. In a standby mode, the access circuit selects one of the word-lines and determines whether to execute the refresh action for the cells coupled to the selected word-line according to the retention capability of the selected word-line at regular time intervals.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
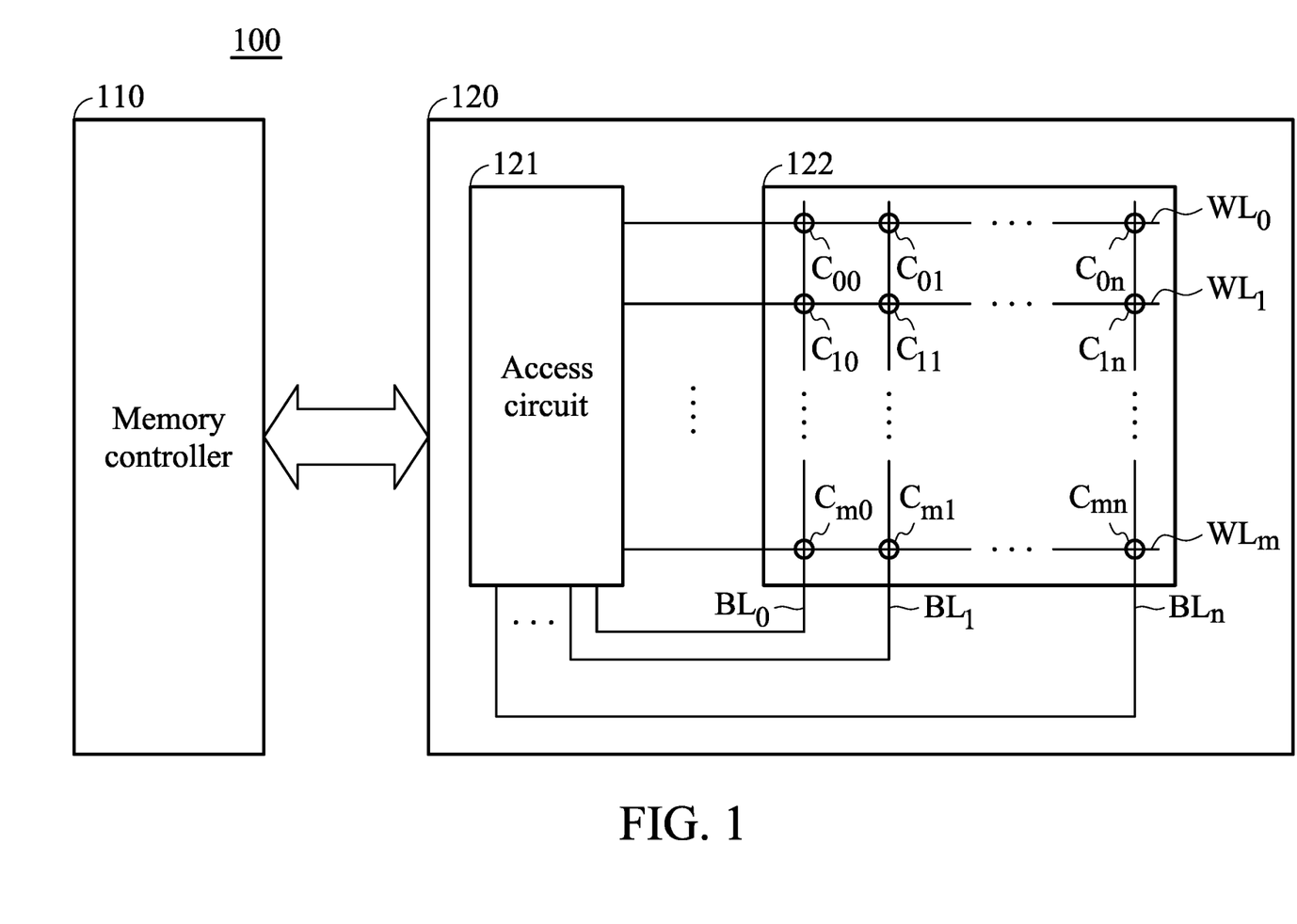
FIG. 1 is a schematic diagram of an exemplary embodiment of a memory system according to various aspects of the present disclosure.

FIG. 1 is a schematic diagram of an exemplary embodiment of a memory system according to various aspects of the present disclosure. The memory system 100 comprises a memory controller 110 and a memory device 120. The memory controller 110 stores data to the memory device 120 or reads data from the memory device 120. In one embodiment, the memory controller 110 outputs an auto-refresh command to direct the memory device 120 to refresh data stored in the memory device 120.

The memory device 120 is coupled to the memory controller 110 and operates according to the commands from the memory controller 110. In this embodiment, the memory controller 110 directs the memory device 120 to operates in a normal mode or a standby mode.

In the normal mode, the memory device 120 operates according to the commands (e.g., write commands or read commands) from the memory controller 110. In one embodiment, the memory controller 110 provides a clock signal to the memory device 120. The memory device 120 receives the commands from the memory controller 110 according to the clock signal and executes an access action according to the commands provided by the memory controller 110. For example, when the memory controller 110 outputs a write command, the memory device 120 receives and stores the data provided by the memory controller 110. When the memory controller 110 outputs a read command, the memory device 120 outputs data stored in the memory device 120 to the memory controller 110. In other embodiments, when the memory controller 110 outputs an auto-refresh command, the memory device 120 executes a refresh action for at least one cell in the memory device 120.

In the standby mode, the memory device 120 stops acting on the commands from the memory controller 110. In one embodiment, the memory controller 110 stops providing the clock signal in the standby mode so that the memory device 120 stops executing the access action according to the commands from the memory controller 110. Therefore, in the standby mode, the memory device 120 has lower power consumption than the normal mode. Additionally, in the standby mode, the memory device 120 executes a refresh action on the internal cells by itself at regular time intervals to maintain the correctness of the data.

In this embodiment, in the normal mode, the numbers of times that the refresh action is executed by the memory device 120 on all cell in a refresh period are the same. Furthermore, in the standby mode, the numbers of times that the refresh action is executed by the memory device 120 on the different cells in the same refresh period are different.

For example, in the normal mode, the memory device 120 may execute four-times of the refresh action on each cell in 256 ms. In the standby mode, the memory device 120 may execute two-times of the refresh action on the cells coupled to a first word-line and execute one-time of the refresh action on the cells coupled to a second word-line in 256 ms. In this embodiment, the memory device 120 executes less-times of the refresh action on the cells which have better retention capability so that the power consumption of the memory device 120 in the standby mode is reduced.

When the retention capability of a cell deteriorates, the memory device 120 may execute many times of the refresh action on the corresponding cell. Therefore, each cell is capable of maintaining the correctness of the data so that the reliability of the memory device 120 is greatly improved.

In one embodiment, in the standby mode, although the operation of the memory device 120 stops acting on the commands from the memory controller 110, if a wake-up event occurs, the memory device 120 leaves the standby mode and enters the normal mode. The wake-up event is issued by the memory controller 110 or other elements.

In this embodiment, the memory device 120 comprises an access circuit 121 and a memory array 122. The memory array 122 comprises cells $C_{00}$~$C_{mn}$ to store data. Each cell is coupled to one word-line and a bit-line. In one embodiment, the cells $C_{00}$~$C_{mn}$ are arranged into an array. The access circuit 121 is configured to be coupled between the memory controller 110 and the memory array 122. The access circuit 121 is coupled to the memory controller 110 and the memory array 122 and accesses the memory array 122 according to the commands provided from the memory controller 110. In this embodiment, the access circuit 121 accesses the cells $C_{00}$~$C_{mn}$ via the word-lines $WL_0$~$WL_m$ and the bit-lines $BL_0$~$BL_n$. For example, the access circuit 121 may access the cell $C_{00}$ via the word-line $WL_0$ and the bit-line $BL_0$.

In the normal mode, the access circuit 121 performs a refresh action on the cells which are coupled to at least one of the word-lines $WL_0$~$WL_m$ according to the auto-refresh command provided by the memory controller 110. For example, when the memory controller 110 sends an auto-refresh command, the access circuit 121 performs a refresh action on the cells $C_{00}$~$C_{0n}$ which are coupled to the word-line $WL_0$ according to an internal count value. After finishing the refresh action, the access circuit 121 adjusts the count value. Therefore, when the access circuit 121 re-receives an auto-refresh command, the access circuit 121 performs a refresh action on the cells (e.g., $C_{10}$~$C_{1n}$) which are coupled to another word-line (e.g., $WL_1$) according to the adjusted count value.

In the standby mode, the memory controller 110 stops sending the auto-refresh command. Therefore, the access circuit 121 selects one of the word-lines $WL_0$~$WL_m$ at regular time intervals and determines whether to perform a refresh action on the cells coupled to the selected word-line according to the retention capability of the selected word-line. For example, assume that the average of the retention capabilities of the cells $C_{00}$~$C_{0n}$ which are coupled to the word-line $WL_0$ is greater than the average of the retention capabilities of the cells $C_{10}$~$C_{1n}$ which are coupled to the word-line $WL_1$. In such cases, in the standby mode, the number of times that the refresh action is executed by the access circuit 121 on the cells $C_{00}$~$C_{0n}$ coupled to the word-line $WL_0$ in a refresh period (e.g., 256 ms) is less than the number of times that the refresh action is executed by the access circuit 121 on the cells $C_{10}$~$C_{1n}$ coupled to the word-line $WL_1$ in the refresh period.

In some embodiments, the access circuit 121 determines the retention capabilities of all cells arranged in the same row (a horizontal direction) and then calculates the average of the retention capabilities of the cells arranged in the same row. In such cases, the access circuit 121 serves the average of the retention capabilities as the retention capability of a corresponding word-line. In another embodiment, the access circuit 121 compares the retention capabilities of the cells arranged in the same row and serves the minimum retention capability as the retention capability of a corresponding word-line.

The present disclosure does not limit when the access circuit 121 acquires the retention capabilities of the cells $C_{00}$~$C_{mn}$. In one embodiment, the access circuit 121 performs an access action for the memory array 122 to acquire the retention capabilities of the cells $C_{00}$~$C_{mn}$ in a first test period. Then, the access circuit 121 programs the retention capabilities of the corresponding word-lines according to the retention capabilities of the cells $C_{00}$~$C_{mn}$. Taking the cell $C_{00}$ as an example, the access circuit 121 may write specific data to the cell $C_{00}$ and then read the data stored in the cell $C_{00}$ to determine the time that the cell $C_{00}$ maintains the correctness of the data. Assume that the cell $C_{00}$ maintains the correctness of the data within 150 ms. After 150 ms, the data stored in the cell $C_{00}$ is loss. Therefore, the retention capability of the cell $C_{00}$ is 150 ms. In such cases, the access circuit 121 programs that the retention capability of the word-line $WL_0$ coupled to the cell $C_{00}$ is 150 ms. In some embodiments, the access circuit 121 encodes the retention capability of the word-line $WL_0$ to generate at least one digital value (referred to as capability information).

Figure 2:
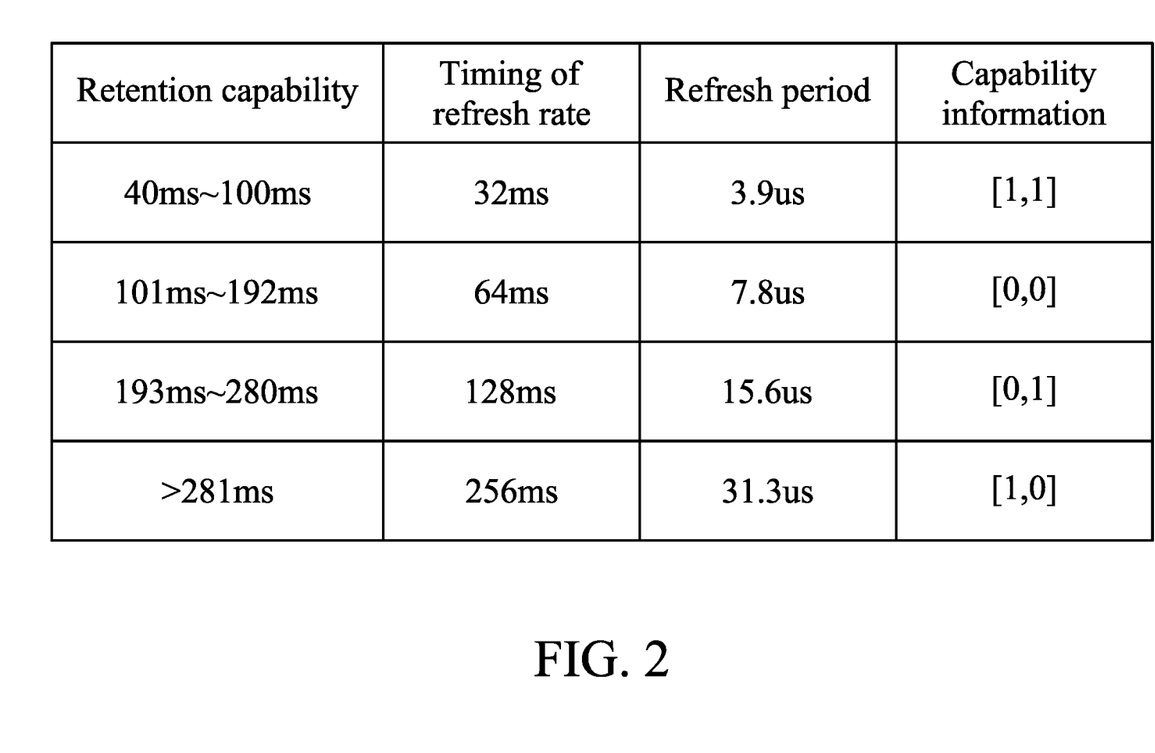
FIG. 2 is a schematic diagram of an exemplary embodiment of a relationship between the retention capability and timing of refresh rate of a word-line.

FIG. 2 is a schematic diagram of an exemplary embodiment of a relationship between the retention capability and timing of refresh rate of a word-line. Taking the word-line $WL_0$ as an example, if the retention capability of the word-line $WL_0$ is within the refresh frequency group 40 ms~100 ms, the access circuit 121 executes one-time of the refresh action on all cells $C_{00}$~$C_{0n}$ coupled to the word-line $WL_0$ during 32 ms. Assume that the number of word-lines coupled to the access circuit 121 is 8192. In such cases, the access circuit 121 executes a refresh action on all cells coupled to the word-line $WL_0$ at regular time intervals, such as 3.9 us (32 ms/8192). In some embodiments, the access circuit 121 encodes the retention capability of the word-line $WL_0$ to program the capability information of the word-line $WL_0$ to [1,1].

In other embodiments, if the retention capability of the word-line $WL_0$ is within the refresh frequency group 101 ms~192 ms, the access circuit 121 executes one-time of the refresh action on all cells coupled to the word-line $WL_0$ during 64 ms. In such cases, the access circuit 121 executes a refresh action on all cells coupled to the word-line $WL_0$ at regular time intervals, such as 7.8 us (64 ms/8192). Additionally, the access circuit 121 encodes the retention capability of the word-line $WL_0$ to program the capability information of the word-line $WL_0$ to [0,0].

If the retention capability of the word-line $WL_0$ is within the refresh frequency group 193 ms~280 ms, the access circuit 121 executes one-time of the refresh action on all cells $C_{00}$~$C_{0n}$ coupled to the word-line $WL_0$ during 128 ms. In such cases, the access circuit 121 executes a refresh action on all cells coupled to the word-line $WL_0$ at regular time intervals, such as 15.6 us (128 ms/8192). Furthermore, the access circuit 121 encodes the retention capability of the word-line $WL_0$ to generate the capability information [0,1].

If the retention capability of the word-line $WL_0$ exceeds the refresh frequency group 281 ms, the access circuit 121 executes one-time of the refresh action on all cells $C_{00}$~$C_{0n}$ coupled to the word-line $WL_0$ during 256 ms. In such cases, the access circuit 121 executes a refresh action on all cells coupled to the word-line $WL_0$ at regular time intervals, such as 31.3 us (256 ms/8192). In addition, the access circuit 121 encodes the retention capability of the word-line $WL_0$ to generate the capability information [1,0].

In this embodiment, each capability information has two bits to indicate four refresh frequency groups, such as 40 ms~100 ms, 101 ms~192 ms, 193 ms~280 ms, and >281 ms. In other embodiments, when the capability information has more or fewer bits, the capability information is capable of corresponding more or fewer refresh frequency groups. For example, if the capability information has three bits, the capability information is capable of corresponding eight refresh frequency groups.

Since the access circuit 121 adjusts the number of times that the refresh action is executed on the cells $C_{00}$~$C_{mn}$ according to the capability information of the word-lines in the standby mode, the access circuit 121 reduces the number of times that the refresh action is executed on the cells coupled to the word-line which has high capability information. Therefore, the standby current of the memory device 120 is reduced and the memory device 120 is capable of serving as a low-power memory. In this embodiment, even if the number of times that the refresh action is executed is reduced, each cell is capable of maintaining the correctness of the data. Therefore, the reliability of the memory device 120 is not interfered by the number of times that the refresh action is executed.

In other embodiments, the retention capability of each cell may gradually degrade due to temperature and usage time. Therefore, the access circuit 121 may wait an operation time and then determine whether the retention capability of each of the cells $C_{00}$~$C_{mn}$ has changed. When the retention capability of one of the cells $C_{00}$~$C_{mn}$ has changed, for example, from a refresh frequency group to another refresh frequency group, the access circuit 121 updates the capability information of the corresponding word-line. After updating, the degradation cell is capable of maintaining the correctness of the data. Therefore, the life and the reliability of the memory device 120 are increased.

For example, in a second test period, the specific data is re-written to the cells $C_{00}$~$C_{mn}$ to determine whether the retention capability of each of the cells $C_{00}$~$C_{mn}$ has changed. Taking the cells $C_{00}$~$C_{0n}$ as an example, if the minimum retention capability of the cells $C_{00}$~$C_{0n}$ degrades from 200 ms to 90 ms, the access circuit 121 updates the capability information of the word-line $WL_0$, such as from [0,1] to [1,1].

The present disclosure does not limit when the retention capability of each of the cells $C_{00}$~$C_{mn}$ is programmed. In one embodiment, during a test stage before packaging a chip, a test operation is performed on the cells $C_{00}$~$C_{mn}$ to program the retention capabilities of the cells $C_{00}$~$C_{mn}$. Then, after packaging the chip, the test operation is re-performed on the cells $C_{00}$~$C_{mn}$. In other embodiments, in a test stage after packaging the chip and before leaving the factory, the test operation is performed. Then, in the operation period that the memory device 120 is installed in an electrical product, the test operation is re-performed to update the capability information of the word-lines $WL_0$~$WL_m$. For example, after the memory device 120 is powered on for the first time, the memory device 120 starts to record the number of times it is powered on. When the number of times that the memory device 120 is powered on arrives a predetermined value, the memory device 120 performs the test operation on the memory array 122 to update the capability information of the word-lines $WL_0$~$WL_m$.

Figure 3:
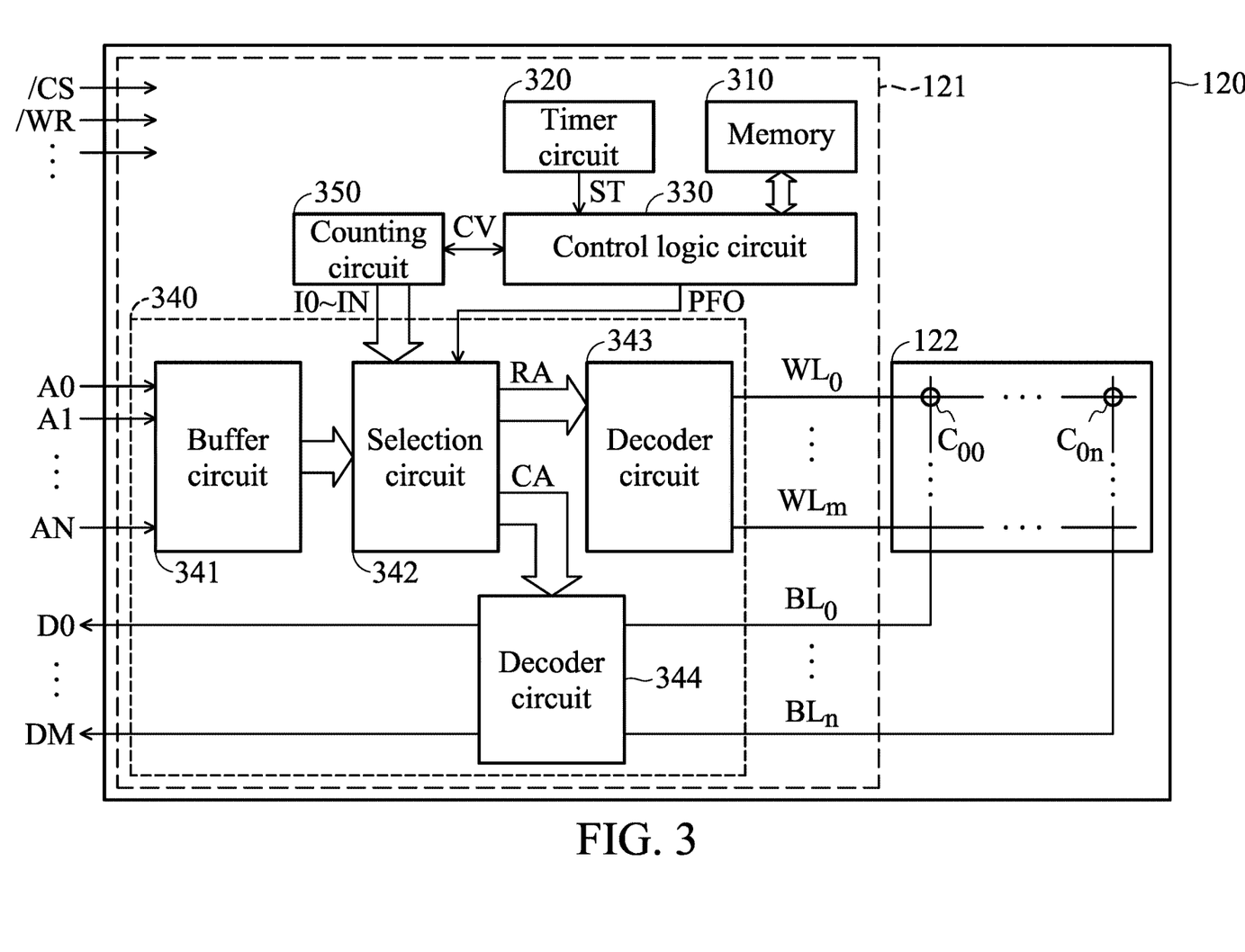
FIG. 3 is a schematic diagram of an exemplary embodiment of a memory device according to various aspects of the present disclosure.

FIG. 3 is a schematic diagram of an exemplary embodiment of the memory device 120 according to various aspects of the present disclosure. The memory device 120 comprises the access circuit 121 and the memory array 122. The access circuit 121 is configured to access the memory array 122. In the normal mode, the access circuit 121 performs a refresh action on the memory array 122 according to an auto-refresh command sent by an external memory controller. At this time, the frequency that the memory array 122 performs the refresh action is the same as the frequency that the external memory controller sends the auto-refresh command. In the standby mode, the access circuit 121 performs the refresh action on the memory array 122 in fixed intervals of time. At this time, the frequency that the refresh action is performed is controlled by the access circuit 121. In some embodiments, the refresh action that is performed by the access circuit 121 in the normal mode is referred to as auto refresh (AR). In such cases, the refresh action that is performed by the access circuit 121 in the standby mode is referred to as self-refresh (SR).

The structure of access circuit 121 is not limited in the present disclosure. Any circuit can serve as the access circuit 121, as long as the circuit is capable of determining the number of times that the refresh action is executed according to the capability information of each word-line. In this embodiment, the access circuit 121 comprises a memory 310, a timer circuit 320, a control logic circuit 330 and a driving circuit 340.

The memory 310 is configured to store the capability information of each word-line. The type of memory 310 is not limited in the present disclosure. In one embodiment, the memory 310 is a non-volatile memory. In other embodiments, the memory 310 may be a one-time programmable (OTP) memory.

In some embodiments, the memory 310 comprises a plurality of cells. Each cell comprises an e-fuse. When an e-fuse has not blown, the e-fuse represents a first value, such as 0. When an e-fuse has blown, the e-fuse represents a second value, such as 1. In this embodiment, since the capability information of each of the word-lines has two bits, each word-line corresponds to two e-fuses. Assume that the capability information of the word-line $WL_0$ is [0, 1] and corresponds to a first e-fuse and a second e-fuse. In such cases, the first e-fuse has not blown, and the second e-fuse has blown.

As shown in FIG. 2, the capability information [0,1] corresponds to the refresh frequency group 193 ms~280 ms. The access circuit 121 performs the refresh action on the cells coupled to the word-line $WL_0$ every 128 ms. In such cases, when the capability information of the word-line $WL_0$ degrades, the access circuit 121 blows the first e-fuse. Since the first and second e-fuses are blown, it means that the capability information of the word-line $WL_0$ has changed to [1,1]. Therefore, the access circuit 121 performs the refresh action on the cells coupled to the word-line $WL_0$ every 32 ms.

The timer circuit 320 is configured to perform a timer operation. In this embodiment, when the access circuit 121 enters the standby mode, the timer circuit 320 sends a trigger signal ST at regular time intervals. The duration of the regular time interval is not limited in the present disclosure. In one embodiment, the duration of the regular time interval associates with the base timing of refresh rate of the access circuit 121 and the number of word-lines. For example, assume that the base timing of refresh rate of the access circuit 121 is 32 ms and the number of word-lines is 8192. In such cases, since the access circuit 121 needs refresh 8192 of the word-lines in 32 ms, the timer circuit 320 sends a trigger signal ST every 3.9 us (32 ms/8192). In some embodiments, the timer circuit 320 is a timer.

When receiving the trigger signal ST, the control logic circuit 330 reads a count value CV to select specific capability information stored in the memory 310 and generates a control signal PFO according to the specific capability information. When the access circuit 121 operates in the standby mode, the control logic circuit 330 decodes the specific capability information to generate a plurality of control values. The control logic circuit 330 generates the control signal PFO according to the specific value among the control values. In one embodiment, the specific value is equal to a specific logic value (e.g., 1), the control logic circuit 330 enables the control signal PFO. In such cases, when the specific value is not equal to the specific logic value, the control logic circuit 330 does not enable the control signal PFO. In some embodiments, the control logic circuit 330 operates according to the signals (e.g., /CS, /WR) provided by an external memory controller (not shown).

The driving circuit 340 selects one of the word-lines $WL_0 \sim WL_m$ according to external addresses A0~AN or internal addresses I0~IN. For example, when the access circuit 121 operates in the normal mode and an external memory controller sends a write command, the driving circuit 340 writes data D0~DM to the memory array 122 according to the external addresses A0~AN. When the external memory controller sends a read command, the driving circuit 340 reads the memory array 122 according to the external addresses A0~AN to output data D0~DM to the memory controller. When the external memory controller sends an auto-refresh command, the driving circuit 340 selects at least one of the word-lines $WL_0 \sim WL_n$ according to the internal addresses I0~IN and performs the refresh action on the selected word-line.

When the access circuit 121 operates in the standby mode, the driving circuit 340 stops acting on the external addresses A0~AN to access the memory array 122. At this time, the driving circuit 340 selects a specific word-line (e.g., $WL_0$) of the word-lines $WL_0 \sim WL_m$ according to the internal addresses I0~IN and determines whether to perform the refresh action on the cells (e.g., $C_{00} \sim C_{on}$) coupled to the specific word-line according to the control signal PFO. In one embodiment, when the control signal PFO is enabled, the driving circuit 340 performs the refresh action for the cells (e.g., $C_{00} \sim C_{on}$) coupled to the specific word-line (e.g., $WL_0$). When the control signal PFO is not enabled, the driving circuit 340 does not perform the refresh action for the cells coupled to the specific word-line.

In this embodiment, the driving circuit 340 comprises a buffer circuit 341, a selection circuit 342, decoder circuits 343 and 344. The buffer circuit 341 is configured to temporarily stores the external addresses A0~AN. The selection circuit selects the external addresses A0~AN or the internal addresses I0~IN according to the control signal PFO. When the selection circuit 342 selects the external addresses A0~AN, the selection circuit 320 generates a row address RA and a column address CA according to the external addresses A0~AN. When selecting the internal addresses I0~IN, the selection circuit 342 generates the row address RA and the column address CA according to the internal addresses I0~N. In one embodiment, the selection circuit 342 is a multiplexer. The decoder circuit 343 decodes the row address RA to select at least one of the word-lines $WL_0 \sim WL_m$. The decoder circuit 344 decodes the column address CA to select at least one of the bit-lines $BL_0 \sim BL_n$ to store the data D0~DM to the corresponding cells or read the corresponding cells to output the data D0~DM.

In other embodiments, the access circuit 121 further comprises a counting circuit 350. The counting circuit 350 is configured to provide the count value CV. In some embodiments, the counting circuit 350 directly provides the count value CV to the control logic circuit 330. In such cases, the counting circuit 350 may transform the count value CV into the internal addresses I0~IN and then provide the internal addresses I0~IN to the driving circuit 340. In this embodiment, each count value CV corresponds to one of the word-lines $WL_0 \sim WL_m$. After outputting the internal addresses I0~IN, the counting circuit 350 adjusts the count value CV. When the count value arrives a predetermined value, the counting circuit 350 resets the count value CV. In one embodiment, the predetermined value is equal to the number of word-lines. In some embodiments, the counting circuit 350 is a counter.

In other embodiments, when the access circuit 121 operates in the normal mode, the control logic circuit 330 acts on an auto-refresh command to direct the counting circuit 350 to transform the count value CV into the internal addresses I0~IN. the control logic circuit 330 controls the selection circuit 342 to select the internal addresses I0~IN. the decoder circuit 343 selects a corresponding word-line according to the row address RA and performs the refresh action for the cell coupled to the corresponding word-line. In such cases, after the counting circuit 350 outputs the internal addresses I0~IN to the driving circuit 340, the control logic circuit 330 adjusts the count value CV. In some embodiments, the control logic circuit 330 directly reads the count value CV and transform the count value CV into the internal addresses I0~IN. The control logic circuit 330 provides the internal addresses I0~IN to the driving circuit 340. In such cases, after the control logic circuit 330 reads the count value CV, the counting circuit 350 adjusts the count value.

Figure 4:
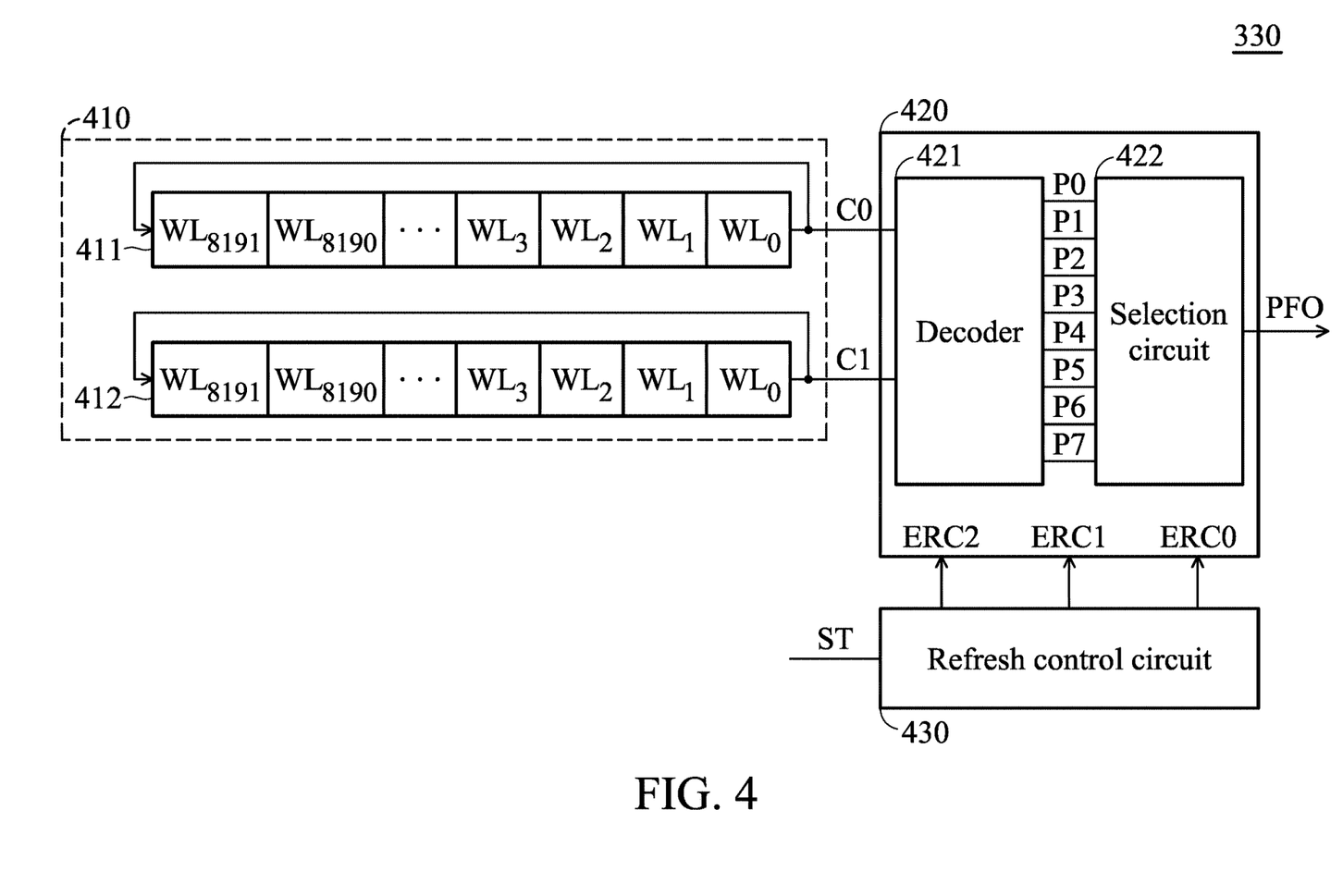
FIG. 4 is a schematic diagram of an exemplary embodiment of a control logic circuit according to various aspects of the present disclosure.

FIG. 4 is a schematic diagram of an exemplary embodiment of a control logic circuit according to various aspects of the present disclosure. The control logic circuit 330 comprises a register circuit 410 and a decoder circuit 420. The register circuit 410 is configured to temporarily store the capability information of each word-line stored in the memory 310. Assume that the number of word-lines is 8192. In such cases, the register circuit 410 temporarily stores 8192 pieces of capability information. Each capability information indicates the retention capability of one word-line. In this embodiment, each capability information has two bits (referred to as C0 and C1). Therefore, the register circuit 410 comprises queues 411 and 412. The queue 411 stores the value of the bit C0. The queue 412 stores the value of the bit C1. The queues 411 and 412 sequentially output the capability information of the word-lines $WL_0 \sim WL_{8191}$ according to a first-in-first-out (FIFO) method. Taking the word-line $WL_0$ as an example, after the queues 411 and 412 output the values of the bits C0 and C1, the queues 411 and 412 shift the remaining capability information to the right and store the capability information of the word-line $WL_0$ after the capability information of the word-line $WL_{8191}$.

The decoder circuit 420 decodes the values of the bits C0 and C1 to generate a plurality of control values P0~P7 and selects one of the control values P0~P7 according to the selection signals ERC0~ERC2 to generate the control signal PFO. In one embodiment, when the selected control value (e.g., P0) is equal to a specific logic value (e.g., 1), the decoder circuit 420 enables the control signal PFO. When the selected control value (e.g., P0) is not equal to the specific logic value, the decoder circuit 420 does not enable the control signal PFO.

In this embodiment, the decoder circuit 420 comprises a decoder 421 and a selection circuit 422. The decoder 421 decodes the values of the bits C0 and C1 to generate the control values P0~P7. The number of control values is not limited in the present disclosure. In other embodiments, the decoder 421 may generate more or fewer control values. The selection circuit 422 selects one of the control values P0~P7 according to the selection signals ERC0~ERC2 to generate the control signal PFO. In one embodiment, the selection circuit 422 is a multiplexer.

Figure 5:
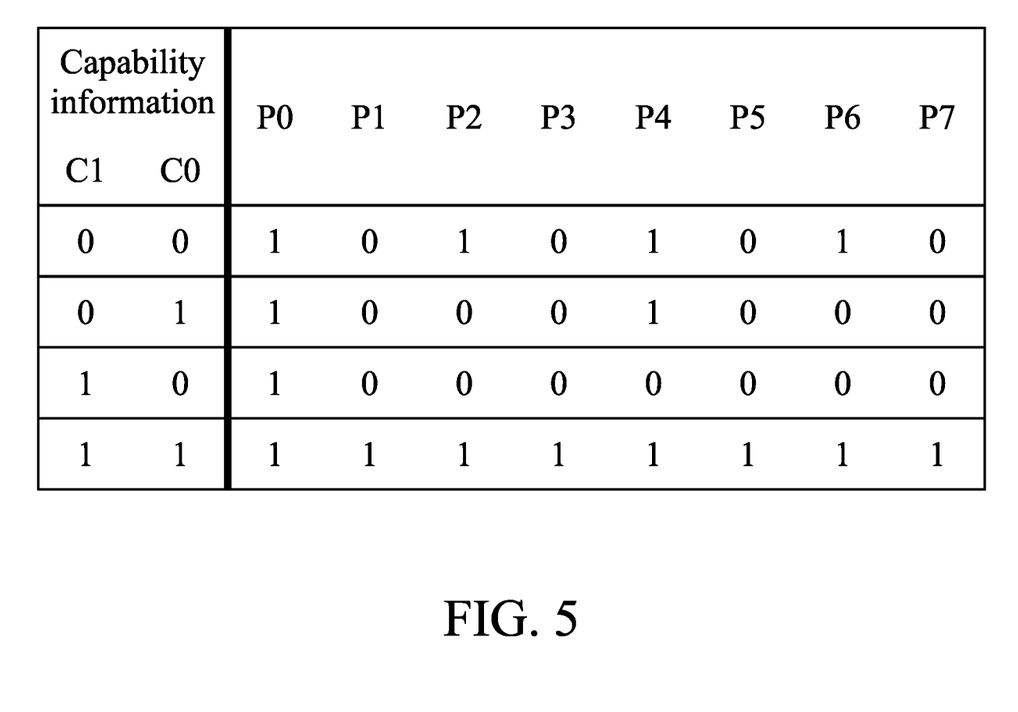
FIG. 5 is a schematic diagram of an exemplary embodiment of a relationship between capability information and control values.

FIG. 5 is a schematic diagram of an exemplary embodiment of a relationship between the capability information and the control values. The control values P0~P7 corresponding to the capability information [0,0] is 1010 1010. The control values P0~P7 corresponding to the capability information [0,1] is 1000 1000. The control values P0~P7 corresponding to the capability information [1,0] is 1000 1000. The control values P0~P7 corresponding to the capability information [1,1] is 1111 1111.

In other embodiments, the control logic circuit 330 further comprises a refresh control circuit 430. The refresh control circuit 430 generates the selection signals ERC0~ERC2 according to the trigger signal ST to direct the selection circuit 422 to select the corresponding control value. Taking the word-line $WL_0$ as an example, the decoder 421 decodes the capability information [0,0] of the word-line $WL_0$ to generate the control values P0~P7. As shown in FIG. 5, the control values P0~P7 corresponding to the capability information [0,0] is 1010 1010. When the register circuit 410 outputs the capability information of the word-line $WL_0$ for the first time, the refresh control circuit 430 utilizes the selection signals ERC0~ERC2 to direct the selection circuit 422 to select the control value P0. At this time, since control value P0 is 1, the selection circuit 422 enables the control signal PFO. Therefore, the driving circuit 340 performs the refresh action for all cells coupled to the word-line $WL_0$. When the register circuit 410 outputs the capability information of the word-line $WL_0$ for the second time, the refresh control circuit 430 directs the selection circuit 422 to select the control value P1. At this time, since control value P1 is 0, the selection circuit 422 does not enable the control signal PFO. Therefore, the driving circuit 340 stops performing the refresh action for all cells coupled to the word-line $WL_0$. When the register circuit 410 outputs the capability information of the word-line $WL_0$ for the third time, the refresh control circuit 430 directs the selection circuit 422 to select the control value P2. At this time, since control value P2 is 1, the selection circuit 422 re-enables the control signal PFO. Therefore, the driving circuit 340 re-performs the refresh action for all cells coupled to the word-line $WL_0$. When the register circuit 410 outputs the capability information of the word-line $WL_0$ for the eighth time, the refresh control circuit 430 directs the selection circuit 422 to select the control value P7. At this time, since control value P7 is 0, the selection circuit 422 does not enable the control signal PFO. Therefore, the driving circuit 340 stops performing the refresh action for all cells coupled to the word-line $WL_0$. In such cases, when the register circuit 410 outputs the capability information of the word-line $WL_0$ for the ninth time, the refresh control circuit 430 directs the selection circuit 422 to select the control value P0. At this time, since control value P0 is 1, the selection circuit 422 enables the control signal PFO. Therefore, the driving circuit 340 performs the refresh action for all cells coupled to the word-line $WL_0$.

In some embodiments, the frequency of the trigger signal ST relates with the retention capability of the corresponding word-line. For example, if the retention capability of a word-line is located at the refresh frequency group 101 ms~192 ms, it means that the driving circuit 340 executes the refresh action for the word-line every 7.8 us. Therefore, the timer circuit 320 shown in FIG. 3 outputs the trigger signal ST every 7.8 us. In such cases, the refresh control circuit 430 generates the selection signals ERC2~ERC0 every 7.8 us. However, when the retention capability of a word-line degrades into the refresh frequency group 40 ms~100 ms, the timer circuit 320 shown in FIG. 3 outputs the trigger signal ST form every 3.9 us. In such cases, the refresh control circuit 430 is configured to adjust the timer circuit 320.

In some embodiments, the refresh control circuit 430 may comprise a frequency divider (not shown). In such cases, if there is no retention capability of a word-line at the refresh frequency group 40 ms~100 ms, the frequency divider is disabled. Therefore, the refresh control circuit 430 generates the selection signals ERC2~ERC0 according to the trigger signal ST every 7.8 us. However, when the retention capability of a word-line is at the refresh frequency group 40 ms~100 ms, the frequency divider is enabled. At this time, the frequency divider processes the trigger signal ST so that the refresh control circuit 430 will generate the selection signals ERC2~ERC0 every 3.9 us (7.8/s).

In other embodiments, the refresh control circuit 430 sends a synchronization clock (not shown) to the register circuit 410 and the decoder circuit 420 to synchronize the operations of the register circuit 410 and the decoder circuit 420. In one embodiment, the refresh control circuit 430 comprises a clock generator to generate the synchronization clock. In some embodiments, the refresh control circuit 430 adjusts the count value of a counting circuit (e.g., 350). In such cases, the refresh control circuit 430 directs the counting circuit to transform the count value into an internal address.

In the standby mode, since the control logic circuit 330 performs the refresh action for the corresponding cells according to the retention capability of the corresponding word-line, the control logic circuit 330 decreases the number of times that the refresh action is performed for the corresponding cells. Therefore, the standby current of the control logic circuit 330 is small. Additionally, the control logic circuit 330 directs the driving circuit 340 to perform the test operation to determine whether the retention capability of each word-line degrade. The control logic circuit 330 adjusts the number of times that the refresh action is performed according to the degree of the retention capability degradation. Therefore, the reliability of the memory device is enhanced substantially.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A memory device coupled to a memory controller, comprising:

a memory array comprising a plurality of cells, wherein each of the cells is coupled to a word-line; and an access circuit configured to be coupled between the memory controller and the memory array and coupled to the memory controller and the memory array, wherein:

in a normal mode, the access circuit executes a refresh action for the cells which are coupled to at least one word-line in response to the memory controller outputting an auto-refresh command, and in a standby mode, the access circuit selects one of the word-lines and determines whether to execute the refresh action for the cells coupled to the selected word-line according to a retention capability of the selected word-line at regular time intervals, the access circuit comprises:

a non-volatile memory storing capability information;

a timer circuit outputting a trigger signal at regular time intervals;

a control logic circuit reading a count value after receiving the trigger signal to select specific capability information among the capability information and generating a control signal according to the specific capability information; and a driving circuit selecting a specific word-line of the word-lines according to the count value and determining whether to execute the refresh action for the cells coupled to the specific word-line according to the control signal, in response to the control signal being enabled, the driving circuit executes the refresh action for the cell coupled to the specific word-line, and in response to the control signal not being enabled, the driving circuit does not execute the refresh action for the cell coupled to the specific word-line.

2. The memory device as claimed in claim 1, wherein in the standby mode, in response to a retention capability of a first word-line of the word-lines being higher than a retention capability of a second word-line among the word-lines, the number of times that the refresh action is executed by the access circuit on the cell coupled to the first word-line in a refresh period is less than the number of times that the refresh action is executed by the access circuit on the cell coupled to the second word-line in the refresh period.

3. The memory device as claimed in claim 2, wherein in the normal mode, the number of times that the refresh action is executed by the access circuit on the cell coupled to the first word-line in the refresh period is equal to the number of times that the refresh action is executed by the access circuit on the cell coupled to the second word-line in the refresh period.

4. The memory device as claimed in claim 1, wherein in a first test period, the access circuit accesses the memory array to acquire the retention capabilities of the cells and encodes the retention capabilities of the cells to generate the capability information, and each capability information corresponds to the retention capability of a corresponding word-line.

5. The memory device as claimed in claim 4, wherein:

in a second test period, the access circuit accesses the cells to determine whether the retention capability of each word-line has changed, in response to the retention capability of the specific word-line among the word-lines having changed from a first refresh frequency group to a second refresh frequency group, the access circuit updates specific information of the capability information, the specific information indicates the retention capability of the specific word-line.

6. The memory device as claimed in claim 5, wherein:

in the standby mode, based on the retention capability of the specific word-line in the first refresh frequency group, the number of times that the refresh action is executed by the access circuit on the cells coupled to the specific word-line in an update period is equal to a first value, in the standby mode, based on the retention capability of the specific word-line in the second refresh frequency group, the number of times that the refresh action is executed by the access circuit on the cells coupled to the specific word-line in the update period is equal to a second value, the second value is greater than the first value.

7. The memory device as claimed in claim 1, further comprising:

a counting circuit providing the count value to the control logic circuit and the driving circuit, wherein after providing the count value to the control logic circuit and the driving circuit, the counting circuit adjusts the count value.

8. The memory device as claimed in claim 1, wherein the non-volatile memory is a one-time programmable memory.

9. The memory device as claimed in claim 1, wherein the control logic circuit comprises:

a register circuit configured to temporarily store the capability information; and a decoder circuit decoding the specific capability information to generate a plurality of control values and generating the control signal according to a specific value of the control values, wherein:

in response to the specific value being equal to a specific logic value, the decoder circuit enables the control signal, in response to the specific value not being equal to the specific logic value, the decoder circuit does not enable the control signal.

10. A memory system comprising:

a memory controller providing data and outputting an auto-refresh command; and a memory device coupled to the memory controller, operating in a normal mode or a standby mode, and comprising:

a memory array comprising a plurality of cells, wherein each of the cells is coupled to a word-line;

an access circuit coupled between the memory controller and the memory array, wherein:

in the normal mode, the access circuit executes a refresh action for the cells which are coupled to at least one word-line according to the auto-refresh command, and in the standby mode, the access circuit selects one of the word-lines and determines whether to execute the refresh action for the cells coupled to the selected word-line according to a retention capability of the selected word-line at regular time intervals, the access circuit comprises:

a non-volatile memory storing capability information:

a timer circuit outputting a trigger signal at regular time intervals;

a control logic circuit reading a count value after receiving the trigger signal to select specific capability information of the capability information and generating a control signal according to the specific capability information; and a driving circuit selecting a specific word-line of the word-lines according to the count value and determining whether to execute the refresh action for the cells coupled to the specific word-line according to the control signal, in response to the control signal being enabled, the driving circuit executes the refresh action for the cell coupled to the specific word-line, and in response to the control signal not being enabled, the driving circuit does not execute the refresh action for the cell coupled to the specific word-line.

11. The memory system as claimed in claim 10, wherein in the standby mode, the memory device has lower power consumption than in the normal mode.

12. The memory system as claimed in claim 10, wherein the memory controller directs the memory device to operate in the normal mode or the standby mode.

13. The memory system as claimed in claim 10, wherein in the standby mode, in response to a retention capability of a first word-line among the word-lines being higher than a retention capability of a second word-line among the word-lines, the number of times that the refresh action is executed by the access circuit on the cell coupled to the first word-line in a refresh period is less than the number of times that the refresh action is executed by the access circuit on the cell coupled to the second word-line in the refresh period.

14. The memory system as claimed in claim 13, wherein in the normal mode, the number of times that the refresh action is executed by the access circuit on the cell coupled to the first word-line in the refresh period is equal to the number of times that the refresh action is executed by the access circuit on the cell coupled to the second word-line in the refresh period.

15. The memory system as claimed in claim 10, wherein in a first test period, the access circuit accesses the memory array to acquire the retention capabilities of the cells and encodes the retention capabilities of the cells to generate the capability information, and each capability information corresponds to the retention capability of a corresponding word-line.

16. The memory system as claimed in claim 15, wherein the control logic circuit comprises:

a register circuit configured to temporarily store the capability information; and a decoder circuit decoding the specific capability information to generate a plurality of control values and generating the control signal according to a specific value of the control values, wherein:

in response to the specific value being equal to a specific logic value, the decoder circuit enables the control signal, in response to the specific value not being equal to the specific logic value, the decoder circuit does not enable the control signal.

17. The memory system as claimed in claim 15, wherein:

in a second test period, the access circuit accesses the cells to determine whether the retention capability of each word-line has changed, in response to the retention capability of the specific word-line among the word-lines having changed from a first refresh frequency group to a second refresh frequency group, the access circuit updates specific information of the capability information, the specific information indicates the retention capability of the specific word-line.

18. The memory system as claimed in claim 10, wherein the access circuit further comprises:

a counting circuit providing the count value to the control logic circuit and the driving circuit, wherein after providing the count value to the control logic circuit and the driving circuit, the counting circuit adjusts the count value.

\* \* \* \* \*